United States Patent [19]

Nazarian et al.

[11] Patent Number: 5,345,112
[45] Date of Patent: Sep. 6, 1994

[54] INTEGRATED CIRCUIT WITH PROGRAMMABLE SPEED/POWER ADJUSTMENT

[75] Inventors: Hagop A. Nazarian, San Jose; S. Barbar Raza, Sunnyvale, both of Calif.

[73] Assignee: Cypress Semiconductor Corporation, San Jose, Calif.

[21] Appl. No.: 945,705

[22] Filed: Sep. 14, 1992

[51] Int. Cl.[5] .................. H03K 19/003; H03F 3/45
[52] U.S. Cl. ................................ 307/443; 307/468; 307/530
[58] Field of Search .............. 307/443, 296.1, 591, 307/594, 465, 468, 530, 296.8

[56] References Cited

U.S. PATENT DOCUMENTS

| | | | |
|---|---|---|---|
| 4,864,162 | 9/1989 | Maoz | 307/296.1 |
| 4,959,564 | 9/1990 | Steele | 307/530 |
| 5,045,717 | 9/1991 | Moen, Jr. et al. | 307/296.1 |
| 5,079,449 | 1/1992 | Obata | 307/468 |

OTHER PUBLICATIONS

Mano, M., *Computer Engineering: Hardware Design*, Prentice Hall, 1988, pp. 96–99.

*Primary Examiner*—Edward P. Westin
*Assistant Examiner*—Jon Santamauro
*Attorney, Agent, or Firm*—Roger S. Borovoy

[57] ABSTRACT

A programmable integrated circuit with adjustable speed/power characteristics having a primary current path which draws a predetermined amount of current; a plurality of impedance elements which generate a reference voltage which controls the current in the current path. One of a plurality of programmable switches is coupled in series, respectively, with one of the plurality of impedance elements, whereby each of the impedance elements can be connected or disconnected by setting its respective programmable switch, thereby adjusting the operating speed and the power consumption of the integrated circuit according to predetermined requirements. The programmable switches used in this invention preferably are erasable, programmable read-only memories.

2 Claims, 4 Drawing Sheets

INTEGRATED CIRCUIT WITH PROGRAMMABLE SPEED/POWER ADJUSTMENT

BACKGROUND OF THE INVENTION AND PRIOR ART

CMOS integrated circuits have become the most popular type of integrated circuits for logic, memory and microprocessors because they require little operating power. Low power is important for battery-powered equipment, such as watches, instruments, and laptop computers. CMOS manufacturing technology has improved over the last ten years, providing channel lengths in the sub-micron range. Therefore, CMOS low power advantages combined with faster device switching speeds, which are extremely important in computer applications, have made CMOS circuits competitive with older bipolar circuits.

The two primary requisites for CMOS integrated circuits are low power and high speed. However, these two requisites are generally in conflict. A CMOS circuit which is optimized for minimum power generally will be slower. Conversely, a CMOS circuit optimized for maximum speed will in most cases inherently draw more current and thus utilize more power. The speed/power relationship is much affected by manufacturing tolerances and varies from chip to chip within a wafer and from wafer to wafer. Typically, the actual speed and power of a particular chip cannot be determined until after the wafer has been completed, separated into individual chips and packaged in a plastic or ceramic package. At this stage, the chips coming off the production line are tested and separated into "bins" according to speed, power and perhaps also other parameters. The selection between higher-speed parts and lower-speed parts is called a "bin split." The highest price is usually obtained for the highest speed chips. However, chips which draw too much power are rejects. High-speed, low-power chips are like "U.S. Prime" beef compared to hamburger.

Unlike the manufacture of automobiles, however, where a "CHEVROLET" is started at the beginning of the assembly line and will continue to be a "CHEVROLET" until it emerges at the end, one does not know whether a semiconductor chip will turn out to be a "CHEVROLET" or a "CADILLAC" until the entire production cycle has been completed. A company expecting to produce "CADILLACS" and ending up mostly with "CHEVROLETS" will, in all likelihood, go broke. A high speed chip usually is the "CADILLAC".

There have been several prior art attempts at tailoring the speed/power characteristics of a CMOS chip. One such method selects one of a set of multiple final metal masks rather than always use the same final mask. Each mask of this set of final masks is designed to make the correct connections among a set of resistors which control one or more primary current paths of the device to achieve a desired speed/power characteristic. The selected value of the resistor will control the current in the controlled current path and therefore affect the switching speed of the CMOS circuit. However, this additional operating current requires additional operating power. The selection of the final metal mask therefore determines the desired speed/power relationship.

An improvement on the above prior art method of controlling device speed/power characteristic has been to test the CMOS circuits at the wafer stage before the final metal mask step and before the device is encapsulated in its final package. Such a test is called an "E-test." The results of this E-test are used as an aid in selecting the final metal mask, as discussed above, to obtain the desired speed/power characteristic.

A prior art technique for saving standby power is to provide fuses on the wafer. Again prior to encapsulation, but in this case after the final metal mask step, one or more of these fuses is laser blown to disable parts of the device which are not needed, but otherwise would draw power. Again, however, the devices have only been tested at the wafer stage, not in their final packaging, when this laser adjustment step takes place. This introduces uncertainty in the results.

The main disadvantage of using different final masks or laser fuses to achieve different speed/power characteristics is inflexibility. After the devices have been finally packaged and tested, if they then fall outside the desired speed/power range, they are rejects and must be discarded. The selected mask or fuse permanently sets the final speed/power characteristics and there is no way, if the packaged device falls outside the desired range, to convert it to a device within the desirable range.

Even using the second technique of E-testing the device prior to final metal mask, it is known that E-tests are carried out on only a few locations on the wafer, and thus are inherently less reliable than final tests after encapsulation, when more complete testing can be done. As a result, many devices may no longer be within the desirable speed/power range after final encapsulation even though they appeared to have been within the desirable range at E-test. Moreover, if this E-test is done before the final metal mask step, the results will be even more suspect.

It would be much more desirable to fully test the CMOS integrated circuit after it has been finally encapsulated and be able then to adjust the speed/power characteristics. This invention enables a chip manufacturer to do just that—take a completed, packaged chip and adjust the speed/power characteristics of that chip without removing the chip from its final package.

SUMMARY OF THE INVENTION

Briefly, the programmable integrated circuit with adjustable speed/power characteristics of this invention has a primary current path which draws a predetermined amount of current. The circuit also has a plurality of impedance elements which generate a reference voltage which in turn controls the current in the integrated circuit. One of a plurality of programmable switches is coupled in series, respectively, with one of the plurality of impedance elements, whereby each of the impedance elements can be connected or disconnected by setting its respective programmable switch, thereby adjusting the operating speed and the power consumption of the integrated circuit according to predetermined requirements.

The programmable switches used in this invention preferably are erasable, programmable read-only memories. If these memories are the U-V erasable type, the lid of the package must be translucent to U-V light, making the package more expensive. Preferably electrically erasable, read-only memories are used which do not require a translucent package. If electrically erasable, read-only memories ($E^2$PROMs) are used, the speed/power characteristics may be programmed merely by placing the integrated circuit in a programmer, or even into the final circuit board in which the circuit is to be used, provided the requisite programming voltages are available at the proper pins of the device. Electrical signals are used to program the $E^2$-PROMs as is well known in the art.

In one embodiment of the invention the impedance elements, such as resistors, control the current flow through one or more sense amplifiers, such as the sense amplifiers used in a memory circuit or a programmable logic device (PLD). Since many circuits have multiple sense amplifiers, and sense amplifiers draw a significant amount of current, the ability to adjust the amount of such current can be used to substantially adjust the speed/power characteristics of the integrated circuit. As will be apparent to one skilled in the art, the adjustable circuit of this invention may be placed in any part of the integrated circuit which draws significant current so that the circuit of the invention can have an impact on the speed/power characteristics of the circuit. One particular location that can be used, according to the invention, to control the current flow in the sense amplifiers, is the circuit which includes the pull-down or pull-up resistors, many of which are found in conventional memory and PLD circuits.

DETAILED DESCRIPTION OF THE INVENTION

Figure 1:
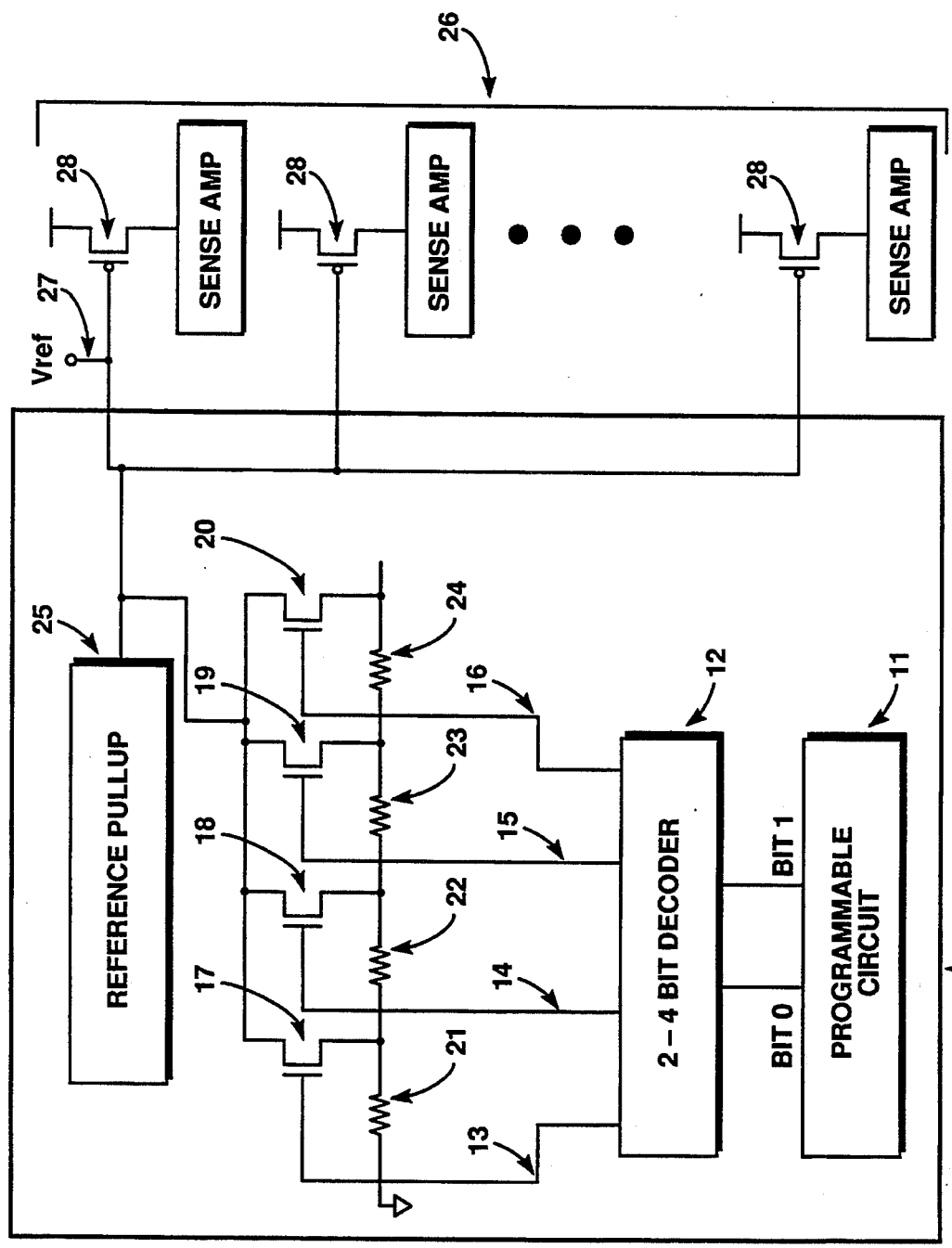
FIG. 1 is a schematic diagram of a circuit for adjusting the speed/power characteristics of an integrated circuit according to a preferred embodiment of this invention.

Referring to FIG. 1, the programmable circuit 10 of a preferred embodiment of the invention is shown. Programmable bits 11 are erasable, programmable read-only memory (EPROM) bits, preferably electrically erasable ($E^2$PROM). In the example in the preferred embodiment, two bits, bit 0 and bit 1, are illustrated. However, any desired number of bits may be used according to the granularity required of the impedance selection in accordance with the teachings of the invention. In the example illustrated in FIG. 1, the two programmable bits 11, as is well known in the art, can provide a 1-of-4 selection using decoder 12. Decoder 12 will then place an output signal on one of the four lines 13, 14, 15 or 16. Each of these four lines is connected to the gate of one of the four switching transistors 17, 18, 19 and 20, respectively. Assuming, for example, that decoder 12 provides an output signal on line 13 when it receives an input signal from programmable bits 11 of "00," for example, that signal on line 13, applied to the gate of transistor 17, will cause transistor 17 to turn on. When transistor 17 turns on, resistor 21 will be placed between the reference pull-up circuit 25 and ground. Since transistors 18, 19 and 20 are turned off, resistors 22, 23 and 24 will effectively be out of the circuit.

The voltage at node 27 will be called $V_{ref}$ and node 27 will thus be referred to as the $V_{ref}$ node. Accordingly, where decoder 12 selects line 13, the resistance value between $V_{ref}$ node 27 and ground will be the smallest of the four possible choices, generating the lowest value of $V_{ref}$. The lowest value of $V_{ref}$ causes p-channel transistors 28 to turn on the most heavily, causing maximum current to flow to the sense amplifiers 26, which results in the fastest operating speed for the sense amplifiers.

If the two programmable bits passed to decoder 12 cause the selection of line 14, transistor 18 will be turned on and resistors 21 and 22 connected between ground and $V_{ref}$ node 27. This will result in a higher value of $V_{ref}$ than the value which was selected when transistor 17 was selected, because resistors 21 and 22 are series-connected between $V_{ref}$ node 27 and ground. This higher value of $V_{ref}$ reduces the current through transistors 28 and therefore sense amplifiers 26. Similarly, if line 15 is selected, resistors 21, 22 and 23 are series-connected between $V_{ref}$ node 27 and ground, resulting in a still higher value of $V_{ref}$ and still less current through transistors 28 and sense amplifiers 26. Finally, if line 16 is selected, connecting transistor 20 in the circuit, series-connected resistors 21, 22, 23 and 24 are all placed in the circuit between $V_{ref}$ node 27 and ground, resulting in the highest possible value of $V_{ref}$ and therefore the least current through transistors 28 and sense amplifiers 26. Accordingly, the selection of line 16 will result in the lowest amount of current through transistors 28 and sense amplifiers 26, providing the slowest operating speed of the four possibilities, but will use the minimum power.

Figure 2:
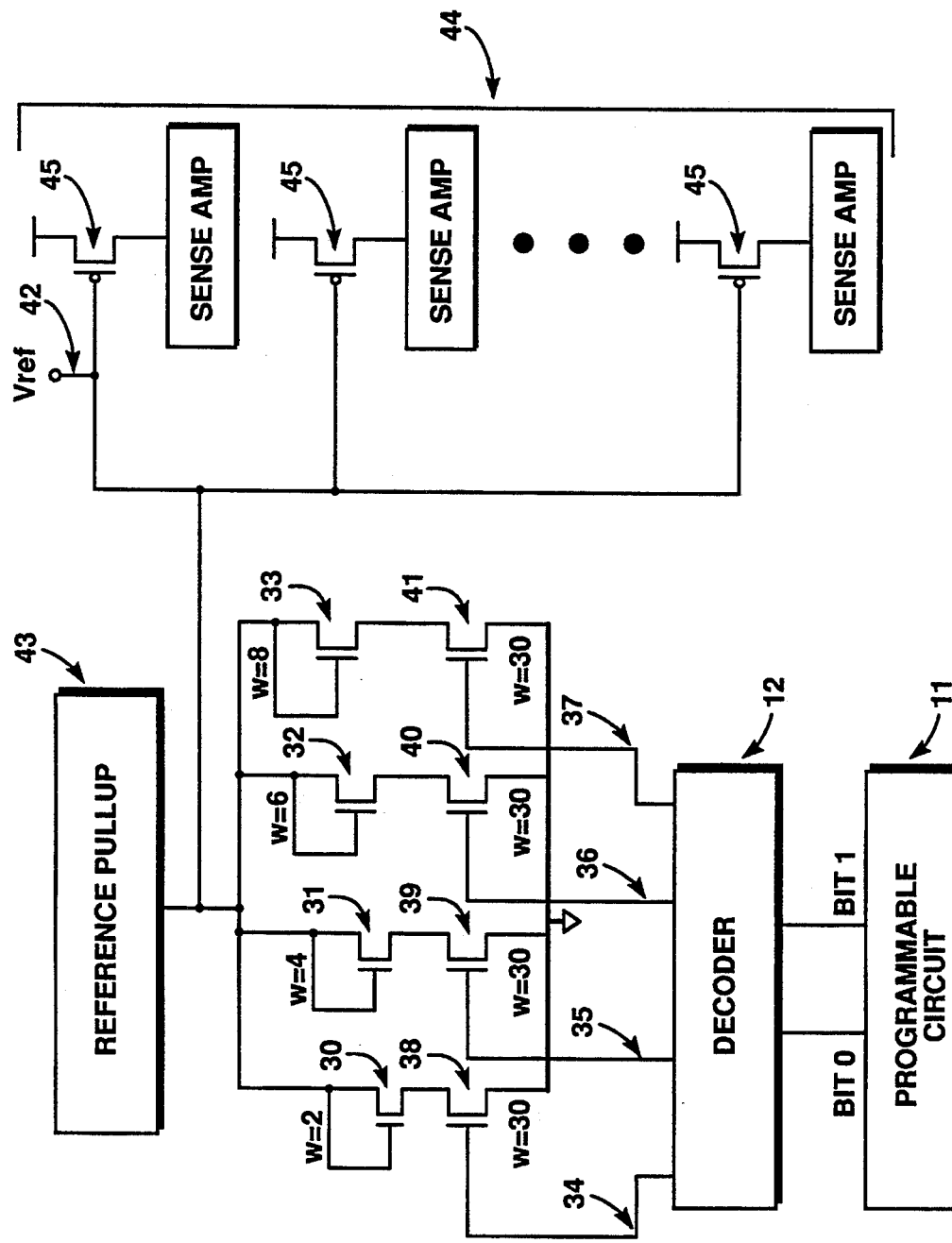
FIG. 2 is a schematic diagram of a circuit for adjusting the speed/power characteristics of an integrated circuit according to another embodiment of this invention.

Referring to FIG. 2, another embodiment of the invention is shown. Instead of using a plurality of resistors as the impedance elements, the embodiment shown in FIG. 2 uses a plurality of MOS transistors of varying gate widths. Each of these MOS transistors 30, 31, 32 and 33 has its gate connected to its drain. Transistor 30 has the smallest gate width, for example, 2 microns; transistor 31 has a gate width higher than 2 microns, for example, 4 microns; transistor 32 has a higher gate width, for example, 6 microns; and transistor 33 has the highest gate width, for example, 8 microns. As was the case with the embodiment shown in FIG. 1, the choice of programmable bits 11 determines which of lines 34, 35, 36 or 37 is selected by decoder 12. The selection of line 34 turns on transistor 38; the selection of line 35 turns on transistor 39; the selection of line 36 turns on transistor 40, and the selection of line 37 turns on transistor 41. All of these selection transistors are large devices which have a preferable gate width of about 30 microns. Using such a large gate width makes certain that the switching transistors 38, 39, 40, and 41 do not limit the resistance of the series circuits which include, respectively, transistors 30, 31, 32, and 33.

The operation of the embodiment of FIG. 2 is essentially the same as the operation of the embodiment of FIG. 1, except that MOS transistors 30, 31, 32 and 33, connected as resistance devices, are used instead of the resistors 21, 22, 23 and 24 used in the preferred embodiment of FIG. 1. Again, the selection of transistor 41 results in the lowest value of $V_{ref}$ at $V_{ref}$ node 42, thereby generating the highest value of current through p-channel transistors 45 and sense amplifiers 44, resulting in the fastest speed of operation, but generating the most power. Conversely, the selection of transistor 38 results in the highest voltage value at $V_{ref}$ node 42, resulting in the lowest current through p-channel transistors 45 and sense amplifiers 44, and thus the slowest speed but the lowest power consumption.

Figure 3:
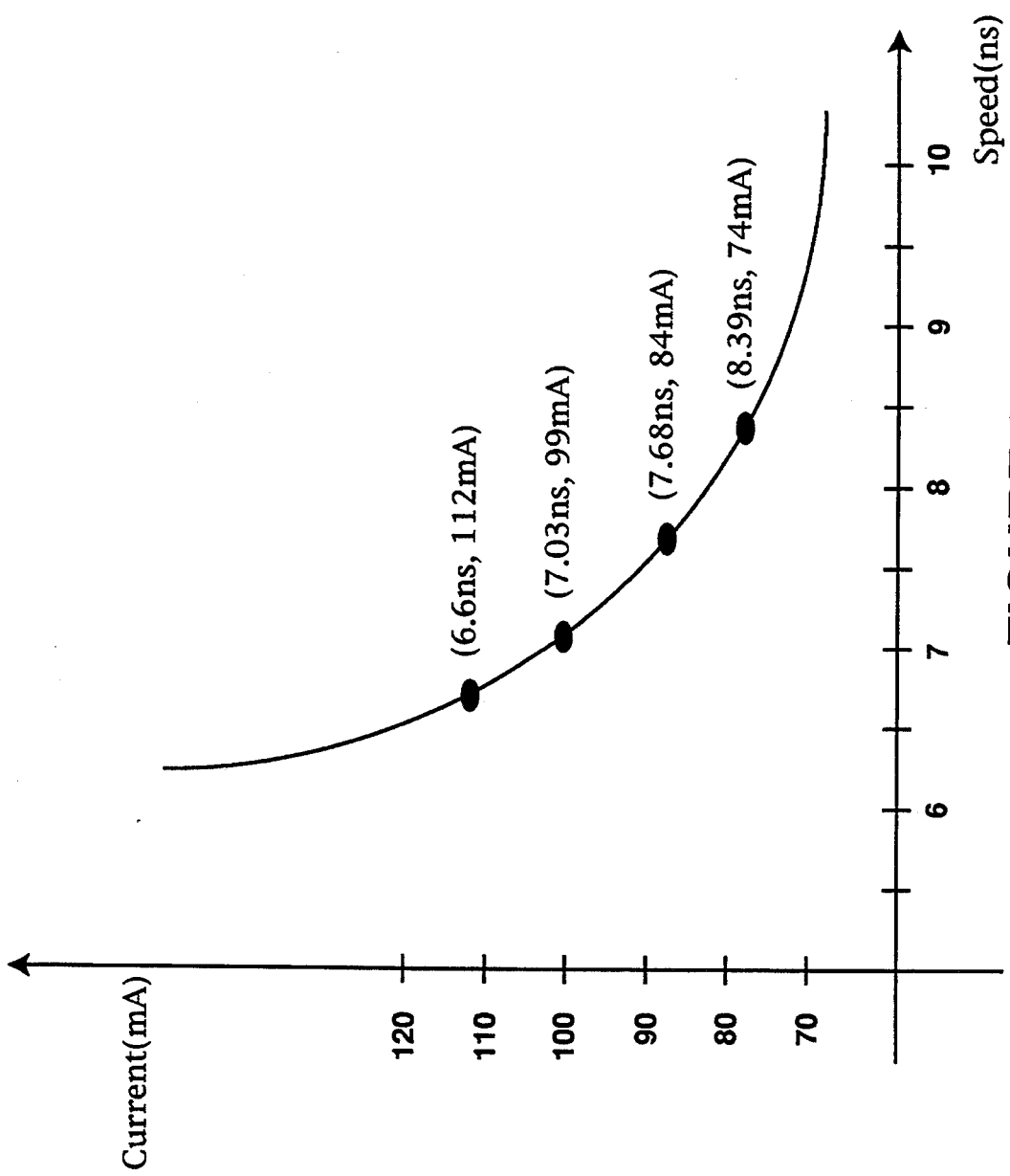
FIG. 3 is a graph showing a typical current versus speed curve for a typical integrated circuit which has been programmed according to the invention.

Referring to FIG. 3, the operating current $I_{cc}$ (in milliamps) is plotted against switching speed (in nanoseconds) for an example of a PLD using the invention. Referring to FIGS. 1 and 3, when decoder 12 selects line 13, the resulting circuit will have a fast operating speed of 6.6 nanoseconds and operate at a high current of 112 milliamps. If line 14 is selected by decoder 12, resulting in a higher resistance (the combination of resistor 21 and resistor 22) between $V_{ref}$ node 27 and ground and thus a lower current through transistors 28 and sense amplifiers 26, the speed slows to 7.03 nanoseconds, but the operating current (and hence the power requirements) drops to 99 milliamps. Similarly, the selection of line 15 results in a speed of 7.68 nanoseconds with an operating current of 84 milliamps. Finally, selecting line 16 results in the slowest 8.39 nanosecond speed but with operating current of only 74 milliamps. FIG. 3 illustrates a typical range of speed/power characteristics which a particular PLD may achieve using the circuit of the preferred embodiment of this invention shown in FIG. 1.

Figure 4:
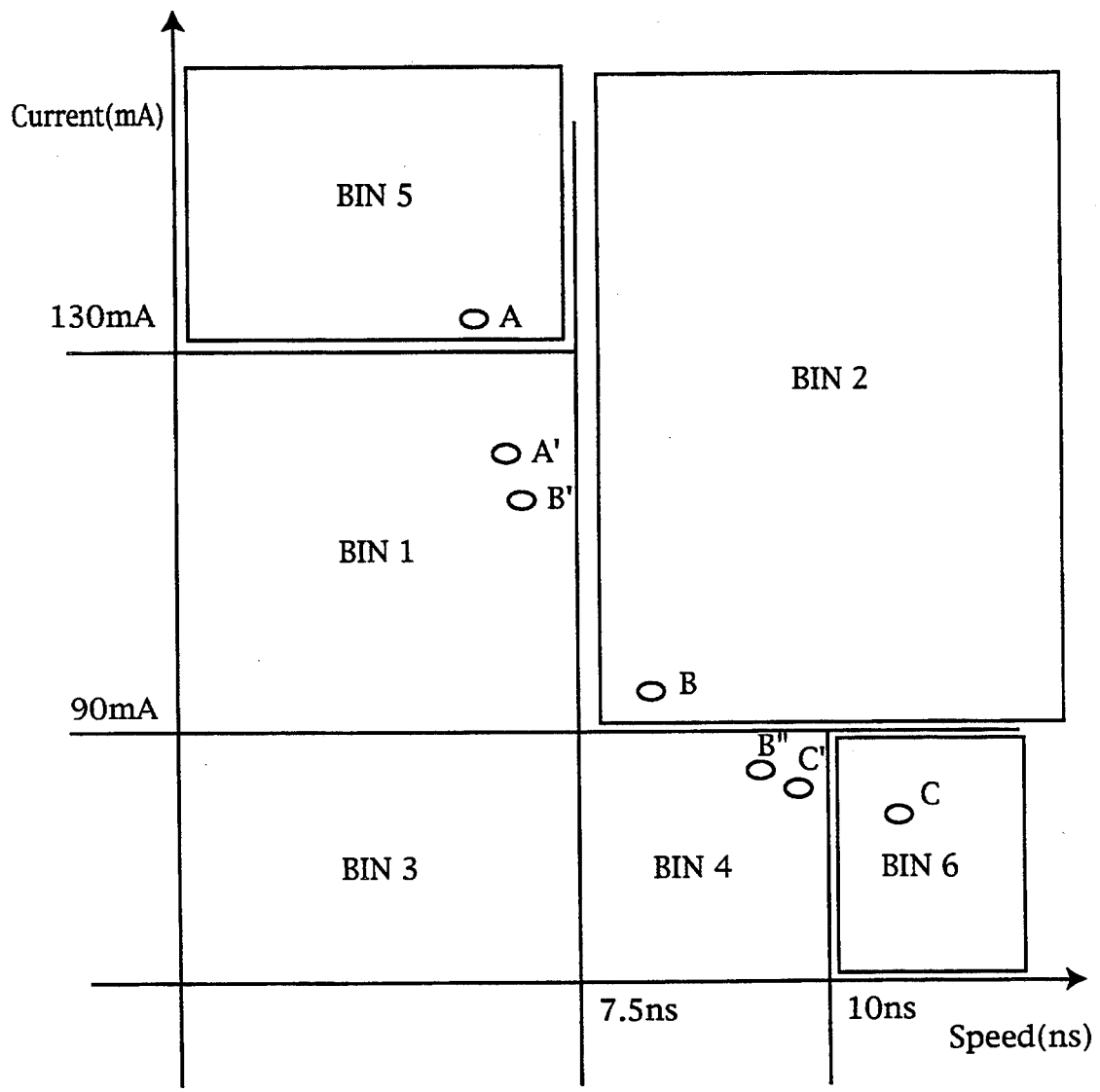
FIG. 4 is a graph showing current versus speed with shaded portions illustrating the desirable and undesirable ranges of speed/power characteristics for typical integrated circuits.

FIG. 4 illustrates how the circuit of the invention can be used. The graph shows the operating current in milliamps versus speed in nanoseconds. Referring to FIGS. 1 and 4, a production run of integrated circuits is tested with the programmable bits in programmable circuit 11 (shown in FIG. 1) being set in the default mode, which will cause decoder 12 to place a signal on line 14, connecting transistor 18 and resistors 21 and 22 into the circuit. The speed and power of the devices will be tested and the test will show in which area of the graph of FIG. 4 the speed/power characteristics of each device lies. It is normally preferred that the devices fall either into bins 1, 2, or 4. Bin 1 parts will have a fast operating speed below 7.5 nanoseconds and a satisfactory operating current below 130 milliamps. In this example, it was determined that an operating current above about 130 milliamps would result in too much power utilization for the part to be useful. Accordingly, all parts drawing more power than that will be put either into bin 5 or bin 2 (depending on speed) as non-usable.

Bin 1 parts are high-power, high-speed parts, between 90 and 130 milliamps and between 5.0 and 7.5 nanoseconds. Since they are below the 130 milliamp current (and thus power) maximum, they are still usable. Because they are in the highest speed range between 5.0 and 7.5 nanoseconds, they are also highly desirable from a customer's standpoint.

Similarly, the parts in bins 3 and 4 are desirable because they are low power parts, drawing an operating current below 90 milliamps. Bin 3 devices between 50 and 90 milliamps and below 7.5 nanoseconds speed are the most desirable because they are both the highest speed and lowest power. However, typically the yield in bin 3 is low. Bin 4 parts are slower, but still in the acceptable speed range between 7.5 and 10 nanoseconds. Bin 2 parts are generally not acceptable because they are either above the maximum current (and power) level of 130 milliamps, or are above 90 milliamps and also in the slower speed range between 7.5 and 10 nanoseconds.

Using EPROMS or E²PROMS for the programmable bits, the circuits of the invention not only are programmable, but reprogrammable. The ability to adjust and readjust the speed/power characteristics using the circuit of this invention on products that have been completed, packaged, and tested is a substantial advantage over the less reliable techniques used in prior art.

A principal advantage of this invention is that once the devices have been tested and sorted, the speed/power characteristics can be adjusted by programming the programmable circuit 11 (FIG. 1). If on the first test too many parts fall, for example, in the undesirable bin 2 because they draw too much power when tested using the default mode which selected line 14 (the medium-speed, medium-power option), some or all of these devices may be reprogrammed by changing the code of the programmable bits of programmable circuit 11 to select one of the other lines 13, 15, or 16 instead. For example, if output line 15 instead of 14 is selected by decoder 12, the device should become slower but draw less power. Accordingly, it is possible to shift devices which previously fell into undesirable bin 2 into more desirable bin 1, which are slower (but still acceptable), yet below the maximum power, and hence saleable.

Referring to FIG. 4, assume that a particular device A falls, as shown, in bin 5. Assume that the device was tested in the default mode where (referring to FIG. 1) decoder 12 selected line 14. It is apparent from FIG. 4 that if the power requirements of device A were lessened somewhat, the device could possibly be moved from bin 5 to bin 1. Accordingly, if the programmable circuit 11 is reprogrammed to select line 15 instead of line 14, the power will be reduced with the concomitant penalty of becoming somewhat slower. When this change is made, device A in bin 5 is moved to become device A' in bin 1, as shown in FIG. 4. Since bin 1 devices are saleable, the reprogramming technique of this invention is used to convert a non-saleable bin 5 part to a saleable bin 1 part.

Another example is device B which originally fell into bin 2. With device B, there are two choices. One choice, as was done with device A, would be to reprogram programmable circuit 11 (FIG. 1) from line 14 to line 15 (or even line 16) in order to lower the power (and also lower the speed). When device B is reprogrammed to select line 15, the resulting part is labeled B", which fell into bin 4. The resulting device B" is a slower part, but still saleable because its speed is still between 7.5 and 10 nanoseconds and its power requirement is reduced with current below 90 milliamps.

Alternatively, device B can be reprogrammed to select line 13 instead of the default line 14 (FIG. 1). In that case, the part is speeded up to a faster speed below 7.5 nanoseconds at the expense of drawing a bit more power. The result is shown as device B' in bin 1, again transforming a non-saleable bin 2 part into a saleable bin 1 part.

The final example is device C which, with the default program, fell into bin 6. In this case, reprogramming device C to select line 13 instead of line 14 will speed up the part somewhat, but not enough to take it above the preferred 90 milliamp current limit, thereby placing the device into bin 4. The resulting device C', which previously was an unsalable bin 6 device, has been converted to a saleable bin 4 part.

Compared to the prior art techniques which must be used on unpackaged wafers and which can only be done once, the circuit of this invention has the substantial advantage of being able to test, program, retest, and, if necessary, reprogram and retest again.

As will be appreciated by one skilled in the art, it is not necessary to use decoder 12 for the circuit shown in the preferred embodiment of FIG. 1. Instead, four programmable bits could be used in programmable circuit 11 instead of two to achieve the same selection of one out of four lines. Obviously many more bits and lines than four, and various types of decoders may be used, and many other changes made as will be recognized by those skilled in the art, without departing from the spirit and scope of the invention. Accordingly, the scope of this invention should be limited only as set forth in the claims which follow.

What is claimed is:

1. A programmable logic device having an array of logic devices and a plurality of sense amplifiers with adjustable speed-power characteristics, comprising:

a programmable logic device having a plurality of sense amplifiers, each included in a current path which draws a predetermined amount of current;

a plurality of impedance elements connectable to said integrated circuit in a manner to control current flow in said current path;

a plurality of electrically erasable programmable read-only memories each coupled to one of said plurality of impedance elements, whereby each of the impedance elements can be connected or disconnected by setting its electrically erasable programmable read-only memory, thereby adjusting the operating speed and the power consumption of the programmable logic device by varying the total impedance of the plurality of impedance elements so as to adjust the current through the sense amplifiers according to the speed/power requirements of the integrated circuit.

2. The programmable logic device of claim 1 further including a decoder for programming said electrically erasable programmable read-only memories using fewer input signals than the number of electrically erasable programmable read-only memories, whereby each of the impedance elements can be connected or disconnected by setting its respective electrically erasable programmable read-only memory.

* * * * *

UNITED STATES PATENT AND TRADEMARK OFFICE
CERTIFICATE OF CORRECTION

PATENT NO. : 5,345,112
DATED : September 6, 1994
INVENTOR(S) : Hagop A. Nazarian, et. al.

It is certified that error appears in the above-indentified patent and that said Letters Patent is hereby corrected as shown below:

Title Page:

[75]  Change "Hagop A. Nazarian, San Jose; S. Barbar Raza, Sunnyvale, both of Calif." to read--Hagop A. Nazarian, San Jose; S. Babar Raza, Sunnyvale, both of Calif. --

Signed and Sealed this

Twenty-eight Day of March, 1995

*Attest:*

BRUCE LEHMAN

*Attesting Officer*      *Commissioner of Patents and Trademarks*